United States Patent
Alfieri et al.

(10) Patent No.: US 11,211,248 B2
(45) Date of Patent: Dec. 28, 2021

(54) SIC ELECTRONIC DEVICE FABRICATED BY AL/BE CO-IMPLANTATION

(71) Applicant: ABB Power Grids Switzerland AG, Baden (CH)

(72) Inventors: Giovanni Alfieri, Baden (CH); Vinoth Sundaramoorthy, Wettingen (CH)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/976,667

(22) PCT Filed: Feb. 28, 2019

(86) PCT No.: PCT/EP2019/055041
§ 371 (c)(1),
(2) Date: Aug. 28, 2020

(87) PCT Pub. No.: WO2019/166576
PCT Pub. Date: Sep. 6, 2019

(65) Prior Publication Data
US 2020/0411320 A1    Dec. 31, 2020

(30) Foreign Application Priority Data
Feb. 28, 2018 (EP) ..................... 18159223

(51) Int. Cl.
*H01L 21/04* (2006.01)
*H01L 29/16* (2006.01)
(Continued)

(52) U.S. Cl.
CPC .......... *H01L 21/046* (2013.01); *H01L 29/167* (2013.01); *H01L 29/1608* (2013.01); *H01L 29/872* (2013.01)

(58) Field of Classification Search
None
See application file for complete search history.

(56) References Cited

U.S. PATENT DOCUMENTS

| 3,636,397 A | 1/1972 | Addamiano et al. |
| 5,710,059 A | 1/1998 | Rottner |
| (Continued) | | |

FOREIGN PATENT DOCUMENTS

| CN | 1304551 A | 7/2001 |
| CN | 102468342 A | 5/2012 |
| (Continued) | | |

OTHER PUBLICATIONS

Pensl, Gerhard, et al., "(Nitrogen-Vacancy)-Complex Formation in SiC: Experiment and Theory", Materials Science Forum vol. 556-557, Trans Tech Publications, Switzerland, online Sep. 15, 2007, pp. 307-312.

(Continued)

*Primary Examiner* — Jack S Chen
(74) *Attorney, Agent, or Firm* — Slater Matsil, LLP (57) ABSTRACT

A method for p-type doping of a silicon carbide layer includes first implantation step of implanting aluminum dopants into a preselected region of the silicon carbide layer by ion implantation, an annealing step of annealing the silicon carbide layer after performing the first implantation step, a second implantation step of implanting beryllium dopants into the preselected region by ion implantation before the annealing step. A ratio of the total aluminum dose in the first implantation step to the total beryllium dose in the second implantation step is in a range between 0.1 and 10.

21 Claims, 5 Drawing Sheets

(51) Int. Cl.
*H01L 29/167* (2006.01)
*H01L 29/872* (2006.01)

(56) References Cited

U.S. PATENT DOCUMENTS

| | | | | |
|---|---|---|---|---|
| 6,100,169 | A * | 8/2000 | Suvorov | H01L 29/66068 |
| | | | | 438/519 |
| 6,107,142 | A | 8/2000 | Suvorov et al. | |
| 2015/0034974 | A1 | 2/2015 | Nishio et al. | |
| 2015/0060884 | A1 | 3/2015 | Ota et al. | |
| 2015/0267320 | A1 | 9/2015 | Ohno et al. | |
| 2018/0274125 | A1 | 9/2018 | Eto et al. | |
| 2020/0411320 | A1 * | 12/2020 | Alfieri | H01L 29/872 |

FOREIGN PATENT DOCUMENTS

| | | |
|---|---|---|
| CN | 104347718 A | 2/2015 |
| CN | 104425615 A | 3/2015 |
| CN | 104952708 A | 9/2015 |
| CN | 108026663 A | 5/2018 |

OTHER PUBLICATIONS

National Intellectual Property Administration of the People's Republic of China, Notification of the First Office Action, dated Dec. 17, 2020, 8 pages.

National Intellectual Property Administration of the People's Republic of China, Search Report dated Dec. 9, 2020, 6 pages.

Deak, P., et al., "A Shallow Acceptor Complex in 4H—Sic: AlNAl", Materials Science Forum VIs. 433-436, Silicon Carbide and Related Materials, 2002, pp. 523-526.

Duijn-Arnold, A. Van, et al., "The Electronic Structure of the Be Acceptor Centers in 6H—SiC", Materials Science Forum vols. 338-342 (2000), 5 total pages.

Handy, Evan M., et al., "Al, B, and Ga Ion-Implantation Doping of SiC", Journal of Electronic Materials, vol. 29, No. 11, 2000, 7 total pages.

Ramungul, Nudjarin, et al., "6H—SiC P+N Junctions Fabricated by Beryllium Implantation", IEEE Transactions on Electron Devices, vol. 46, No. 3, Mar. 1999, pp. 465-470.

Krieger, Michael, et al., "Beryllium-Related Defect Centers in 4H—SiC", Materials Science Forum vols. 353-356 (2001), 5 total pages.

Matsuura, Hideharu, et al., "Density and energy level of a deep-level Mg acceptor in 4H—SiC", Japanese Journal of Applied Physics 54 (2015), 8 total pages.

Miyata, Masanori, et al., "Theoretical Study of Acceptor-Donor Complexes in 4H—SiC", Applied Physics Express 1 (2008), 4 total pages.

Negoro, Y., et al., "Electrical activation of high-concentration aluminum implanted in 4H—SiC", Journal of Applied Physics, vol. 96, No. 9, Nov. 1, 2004, 8 total pages.

Rao, Mulpuri V., et al. "Al, Al/C and Al/Si Implantations in 6H—SiC", Journal of Electronic Materials, vol. 25, No. 1 (1996), Special Issue Paper, 6 total pages.

Kimoto, Tsunenobu, et al., p. 21 from "Fundamentals of Silicon Carbide Technology—Chapter 2: Physical Properties of Silicon Carbide", Sep. 22, 2014.

* cited by examiner

| Specie | Energy (keV) | Dose (cm$^{-2}$) |
|--------|--------------|------------------|
| Al | 100 | $1.5 \times 10^{14}$ |
| Al | 60 | $8 \times 10^{13}$ |
| Al | 30 | $4.5 \times 10^{13}$ |
| Al | 10 | $1.3 \times 10^{12}$ |
| Be | 30 | $1.4 \times 10^{14}$ |
| Be | 20 | $8 \times 10^{13}$ |
| Be | 10 | $5 \times 10^{13}$ |

FIG. 4

SIC ELECTRONIC DEVICE FABRICATED BY AL/BE CO-IMPLANTATION

CROSS-REFERENCE TO RELATED APPLICATIONS

This application is a national stage application of International Application No. PCT/EP2019/055041, filed on Feb. 28, 2019, which application claims priority to European Patent Application No. 18159223.9, filed on Feb. 29, 2018, which applications are hereby incorporated herein by reference.

FIELD OF THE INVENTION

The present invention relates to a method for p-type doping of a silicon carbide (SiC) layer, in particular to a method capable of increasing the free hole concentration in p-type regions, and a p-type doped silicon carbide layer with a high free hole concentration in p-type regions.

BACKGROUND OF THE INVENTION

Silicon carbide (SiC) is an attractive semiconductor material for high-power electronic devices. Since introduction of dopants by thermal diffusion is impaired in SiC due to relatively low diffusion coefficients of relevant dopants in SiC, high energy ion-implantation is a common technique to create p/n-type regions in SiC. During ion implantation, dopant atoms are ionized, accelerated and directed at the semiconductor substrate. There, the dopant atoms collide with substrate atoms, gradually lose energy, and finally come to a rest at some depth within the substrate.

During this process, due to the collision of the dopant atoms with substrate atoms, defects are introduced in the substrate's crystal lattice, especially at high implantation doses and implantation energies. Dopant implantation at an elevated temperature (hot implantation) and post-implantation thermal treatments (thermal annealing) is therefore required to reduce the implantation-induced damages. These treatments also place dopants on substitutional sites within the crystal lattice where they are expected to become electrically active.

In order to form p-type regions in SiC, implantation of Aluminum (Al) ions or Boron (B) ions is commonly used. Al is attractive for p-type doping because of its smaller ionization energy compared to other acceptors. However, the electrical activation of Al in SiC is rather low. At room temperature, typically only 1-3% of the implanted Al concentration contributes electrically, depending on the doping level. This poor Al acceptor activation could be due to several reasons including the formation of complexes between the Al acceptor implant and C or Si vacancies formed during the implantation and/or annealing process resulting in neutral or donor behavior, Al acceptor implants residing on electrically inactive interstitial sites, lattice damage, or the presence of thermally stable deep donor defects. For example, carbon vacancies in SiC are reported to have a single donor behavior.

As a consequence, a high amount of Al has to be implanted to obtain a decent free hole concentration. This requires very high implantation doses further causing increased lattice damage. To mitigate such lattice damage a relatively high annealing temperature typically above 1800° C. is required, which has however further detrimental effects. Also, due to the inherent solubility limit of SiC, there is a natural limit to the amount of Al ions which can be implanted in SiC. Hence, the ability to generate p-type SiC regions with a high free hole concentration (low sheet resistivity) by means of Al implantation is severely limited.

Several alternative doping approaches have been studied in the prior art to overcome this limitation.

From the article of Ramungul et al., "6H—SiC P+N Junctions Fabricated by Beryllium Implantation" in IEEE Transactions on Electron Devices, Vol 46, No. 3, March 1999, it is known that Beryllium (Be) as an alternative p-type dopant for implanted silicon carbide (SiC) $p^+n$ junctions can lead to improvement in the forward characteristics compared to Boron (B) implanted $p^+n$ junctions while exhibiting higher reverse leakages.

From the article from Krieger et al., "Beryllium-Related Defect Centers in 4H—SiC" in Materials Science Forum, Vols. 353-356 (2001) pp. 467-470, it is known that Beryllium (Be) implanted in p-type 4H—SiC epilayers doped with a low concentration of Aluminum ($[Al]=8.5\times10^{15}$ $cm^{-3}$) is not suited to generate p-type SiC substrates with low resistivity, in particular because it suffers from significant out-diffusion of Be atoms with the consequence that no shallow Be-related acceptors can be formed in 4H—SiC.

From U.S. Pat. No. 5,710,059 A it is known a method for producing a semiconductor device, comprising a step of implanting first conductivity type impurity dopants of at least two different elements in a semiconductor layer being doped according to a second opposite conductivity type, and after that anneal the semiconductor layer at such a high temperature that one of said elements is diffusing slowly into the semiconductor layer and the other is diffusing rapidly thereinto.

From the article from Mulpuri V. Rao et al., "Al, Al/C and Al/Si Implantations in 6H—SiC", Journal of Electronic Materials, Vol. 25., No. 1, 1996, it is known an attempt to improve electrical activation of Al implants in SiC by co-implantation with carbon (C). Since Al occupies Si lattice sites in SiC, C co-implantation was supposed to produce more vacancies on Si lattices sites into which Al implants can move to become electrically active, thereby also reducing the formation of Al complexes. Further, Si co-implantation was performed to see whether complexing of Al with carbon vacancies or carbon vacancies themselves are responsible for a poor activation. The study showed that neither Aluminum (Al) implantation with Carbon (C) co-implantation nor Aluminum (Al) implantation with Silicon (Si) co-implantation produces an improvement in Al activation in SiC but rather introduces more lattice damage resulting into highly resistive layers.

Thus, a need remains in the art for an effective method to generate p-type SiC substrates providing a high free hole concentration (low resistivity) at room temperature. To achieve this, it is required a method to increase the electrical activation of implanted dopants. Further it is required a method which provides higher free hole concentration at a lower implantation dose and annealing temperature.

SUMMARY OF THE INVENTION

The present invention was made in view of the prior art described above, and the object of the present invention is to provide a method for p-type doping of silicon carbide (SiC) which yields an increased electrical activation of implanted dopants and thus higher free hole concentration in p-type regions, and to provide p-type doped silicon carbide with a higher free hole concentration in p-type regions at room temperature.

The object of the invention is attained by a method for p-type doping of a silicon carbide layer wherein the method comprises: a step of providing the silicon carbide layer; a first implantation step of implanting Al into a preselected region of the silicon carbide layer by ion implantation; an annealing step of annealing the silicon carbide layer after the first implantation step; and a second implantation step of implanting Be into the preselected region by ion implantation before the annealing step, wherein a ratio $D_{Al,tot}/D_{Be,tot}$ of the total Al dose $D_{Al,tot}$ in the first implantation step and the total Be dose $D_{Be,tot}$ in the second implantation step is in a range between 0.1 and 10, exemplarily between 0.3 and 3, more exemplarily in a range between 0.5 and 2 in an area where Al and Be are co-implanted.

The present inventors found that by implanting both the Al dopants and Be dopants before performing an annealing step, the electrical activation of the implanted dopants can be increased compared to prior art methods which perform an annealing step immediately after a single implantation step. Thus, a higher free hole concentration at room temperature is obtained. This effect is attributed to the increased formation of Al—C—Be complexes which are shallower ($E_v$+0.05 eV) over the valence band edge $E_v$ than Al complexes ($E_v$+0.22 eV) or Be complexes ($E_v$+0.23 eV), the formation of which is favored when annealing is performed after each implantation step. It was also found out that for a ratio of total doses in this range, superior results can be achieved. It may by beneficial to have a ratio close to 1. When about the same amount of Al and Be is provided, more of the beneficial Al—C—Be complexes can be formed. In contrast, when there is an excess of implanted Al (or Be, respectively), more of the Al complexes (Be complexes) are formed.

Further developments of the invention are specified in the dependent claims.

In an exemplary embodiment of the method according to the invention, during a time period between the first implantation step and the second implantation step, the temperature of the silicon carbide layer is kept at a temperature below 1200° C., exemplarily below 1000° C., exemplarily below 900° C., more exemplarily below 700° C.

A temperature in this range is significantly below the typical annealing temperature used for electrical activation of dopants in SiC. Keeping the temperature significantly below such typical annealing temperature until both implantation steps are performed favors the formation of the beneficial Al—C—Be complexes and reduces the formation of the less beneficial Al complexes and Be complexes.

In an exemplary embodiment of the method according to the invention, an annealing temperature in the annealing step is above 1500° C., exemplarily above 1600° C., more exemplarily above 1650° C.

In an exemplary embodiment of the method according to the invention, the annealing temperature in the annealing step is below 1800° C., exemplarily below 1750° C.

An annealing temperature within this range is advantageous for repairing implantation damages and electrically activating the implanted dopants.

In an exemplary embodiment of the method according to the invention, at least the preselected region of the silicon carbide layer includes nitrogen atoms at a concentration [N] of at least $10^{16}$ cm$^{-3}$, exemplarily at least $10^{18}$ cm$^{-3}$.

When nitrogen atoms are present in the silicon carbide layer, additional Al—N—Al complexes (Ev+0.11 eV), Be—N—Be complexes (Ev+0.05 eV) and Al—N—Be complexes (Ev+0.09) can be formed. All of them are shallower than Al complexes ($E_v$+0.22 eV) or Be complexes ($E_v$+0.23 eV) and therefore beneficial to increase the free hole concentration at room temperature. The higher the nitrogen concentration, the more nitrogen complexes can be formed.

In an exemplary embodiment of the method according to the invention, the first implantation step is performed before the second implantation step.

By implanting Al ions first, due to their higher atomic mass compared to Be, more vacancy sites are generated. The vacancy sites can absorb interstitials responsible for the formation of immobile and electrically inactive clusters. By having less of these interstitials, the electrical activation of the dopants can be facilitated.

In an exemplary embodiment of the method according to the invention, a total Al implantation dose in the first implantation step is at least $5 \times 10^{13}$ cm$^{-2}$, exemplarily at least $1 \times 10^{14}$ cm$^{-2}$.

In an exemplary embodiment of the method according to the invention, a total Al implantation dose in the first implantation step is below $5 \times 10^{15}$ cm$^{-2}$, exemplarily below $2 \times 10^{15}$ cm$^{-2}$.

The method according to the invention yields an increased electrical activation of the dopants thus a higher free hole concentration for a given implantation dose. Therefore, a lower implantation dose is sufficient to achieve the same free hole concentration as with prior art methods. Advantageously, due to a lower implantation dose, less implantation damage is created in the crystal lattice.

In an exemplary embodiment of the method according to the invention, an activation ratio at room temperature calculated as a ratio between a sheet concentration of free holes in the preselected region after the annealing step and a total dose, which is the sum of the total dose of Be and of the total dose of Al, is above 20%, exemplarily above 30%, more exemplarily above 40%.

According to the invention, the method is characterized in yielding a higher electrical activation ratio compared to the prior art.

The object is also attained by a silicon carbide layer comprising a p-type region, wherein the following inequality applies: 0.1<[Al]/[Be]<10, exemplarily 0.3<[Al]/[Be]<3, more exemplarily 0.5<[Al]/[Be]<2, wherein [Al] is a concentration of aluminum atoms in the p-type region, and [Be] is a concentration of beryllium atoms in the p-type region.

The p-type doped silicon carbide layer according to the invention is characterized in that the concentration of implanted Al and concentration of implanted Be in the p-type region is within the same order of magnitude, exemplary about the same. If this is fulfilled, the free hole concentration at room temperature is increased compared to the prior art.

Further developments of the invention are specified in the dependent claims.

In an exemplary embodiment of the device according to the invention, the concentration of aluminum in the p-type region is higher than $1 \times 10^{18}$ cm$^{-3}$ (i.e. [Al]>$1 \times 10^{18}$ cm$^{-3}$).

The higher the Al concentration, the more of the Al—C—Be can be formed, and the higher is the free hole concentration at room temperature. A high Al concentration in combination with a high Be concentration is characteristic for a highly doped p-type region according to the invention.

In an exemplary embodiment of the device according to the invention, a concentration of nitrogen atoms in the p-type region is at least $1 \times 10^{16}$ cm$^{-3}$, exemplarily at least $1 \times 10^{18}$ cm$^{-3}$.

The presence of nitrogen in the p-type region enables the formation of shallow nitrogen complexes.

In an exemplary embodiment of the device according to the invention, the following inequality applies: 0.1<p/([Al]+

[Be])<1, exemplarily 0.2<p/([Al]+[Be])<1, wherein [Al] is a concentration of aluminum atoms in the p-type region, [Be] is the concentration of Beryllium in the p-type region, and p is a concentration of free holes in the p-type region.

The p-type doped silicon carbide layer according to the invention is characterized in that more of the implanted dopants contribute to the free hole concentration at room temperature.

In an exemplary embodiment of the device according to the invention, the free hole concentration in the p-type region at room temperature is higher than $1\times10^{18}$ cm$^{-3}$, exemplarily higher than $1\times10^{19}$ cm$^{-3}$, more exemplarily higher than $2\times10^{19}$ cm$^{-3}$.

The p-type doped silicon carbide layer according to the invention is characterized in that it facilitates achieving a higher free hole concentration than in the prior art.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF PREFERRED EMBODIMENTS

Figure 1A:
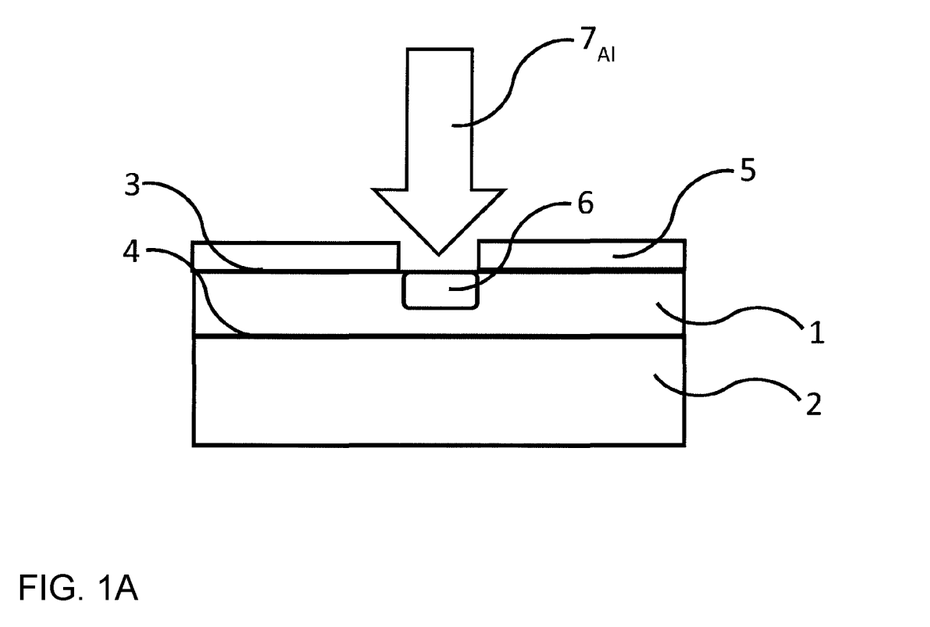
FIG. 1A illustrates the first implantation step of the method for p-type doping of a SiC layer according to the invention.
Figure 1B:
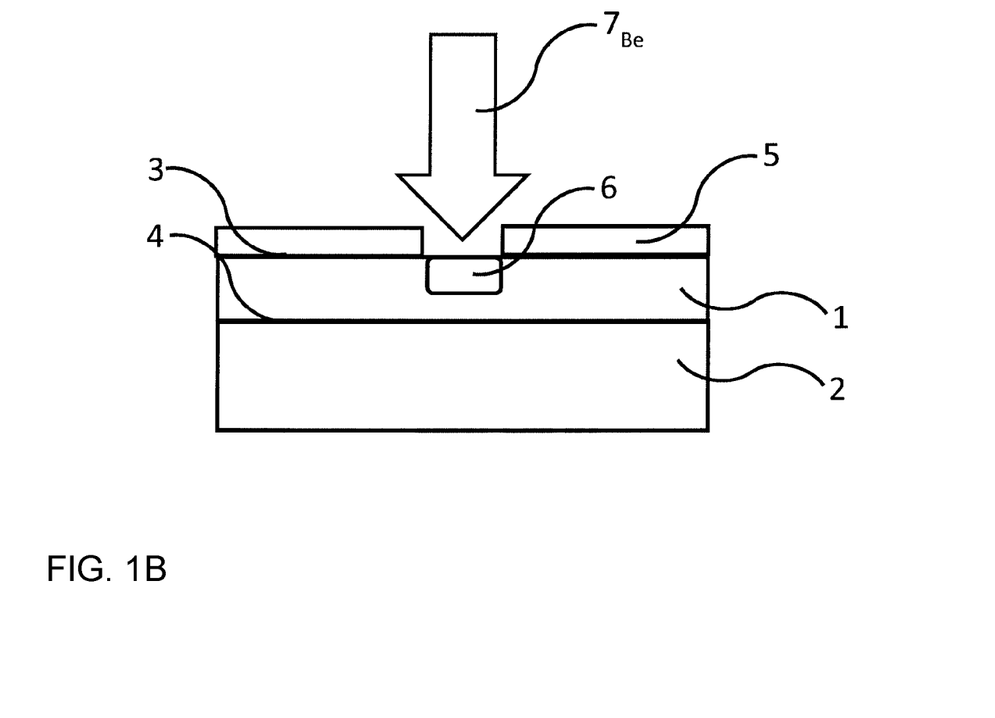
FIG. 1B illustrates the second implantation step of the method for p-type doping of a SiC layer according to the invention.

In the following there is explained a method for p-type doping of a silicon carbide layer according to an exemplary embodiment of the invention. Reference is made to FIGS. 1A and 1B.

In a first step, a silicon carbide (SiC) layer 1 is provided. The SiC layer 1 may be formed on a substrate 2 and has a first main side 3 and a second main side 4 opposite to the first main side 3. An ion beam blocking mask 5 exposing a portion of the first main side 3 may be formed on the SiC layer 1. The SiC of the SiC layer 1 may be any polytype of SiC such as 4H—SiC, 6H—SiC or 3 C—SiC, for example. The substrate 2 may be a SiC substrate. In one embodiment, the SiC layer 1 is n-type and doped with nitrogen (N).

In a first implantation step (see FIG. 1A), Aluminium (Al) dopants are implanted into a preselected region 6 of the SiC layer 1 by ion implantation. Then, in a second implantation step (see FIG. 1B), Beryllium (Be) dopants are implanted into the preselected region 6 of the SiC layer 1 by ion implantation.

Specifically, in the first (second) implantation step, Al atoms (Be atoms) are ionized, accelerated and directed in form of an ion beam $7_{Al}$ ($7_{Be}$) at a surface portion of the SiC layer 1 exposed by the ion beam blocking mask 5. There, they enter the SiC layer 1, collide with intrinsic atoms within the SiC layer, gradually loose energy, and finally come to a rest at some depth within the SiC layer 1. The average depth at which the Al dopants (Be dopants) come to a rest within the SiC layer 1 depends on the implantation energy $E_{Al}$ ($E_{Be}$). The amount of implanted Al dopants (Be dopants) depends on the implantation dose $D_{Al}$ ($D_{Be}$). Implantation energy $E_{Al}$ ($E_{Be}$) and implantation dose $D_{Al}$ ($D_{Be}$) can be controlled to obtain a specific dopant implantation profile. How to control the implantation dose $D_{Al}$ ($D_{Be}$) and implantation energy $E_{Al}$ ($E_{Be}$) to obtain the specific dopant implantation profile is known in the art and may involve multiple implantations $n_{Al}$ ($n_{Be}$) with varying implantation doses $D_{Al,i}$ ($D_{Be,j}$) and implantation energies $E_{Al,i}$ ($E_{Be,j}$), wherein i=1 ... $n_{Al}$ (j=1 ... $n_{Be}$).

Figure 2:
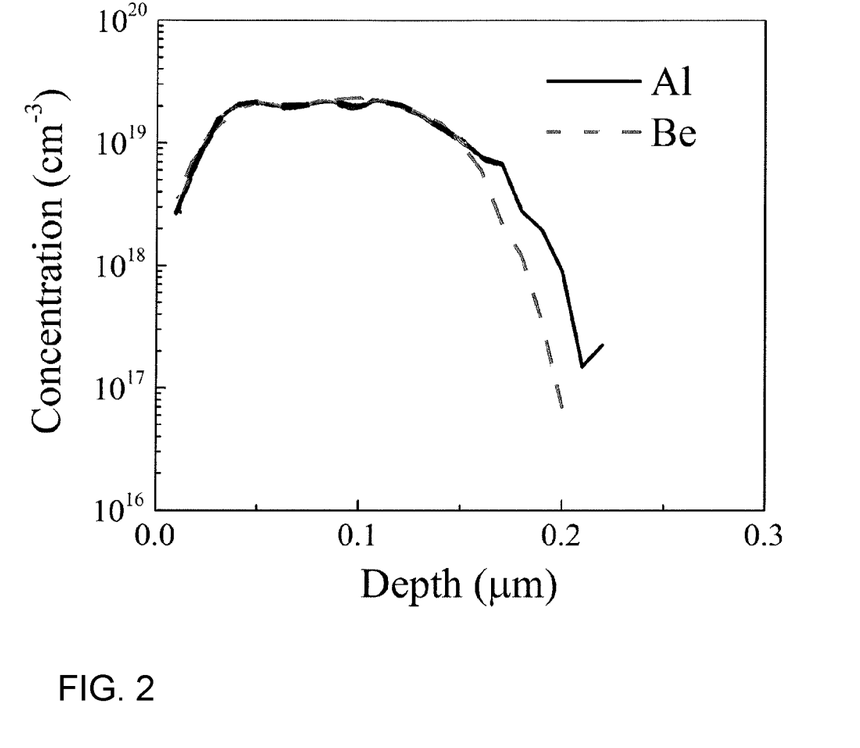
FIG. 2 illustrate exemplary implantation profiles according to the method.
Figure 4:
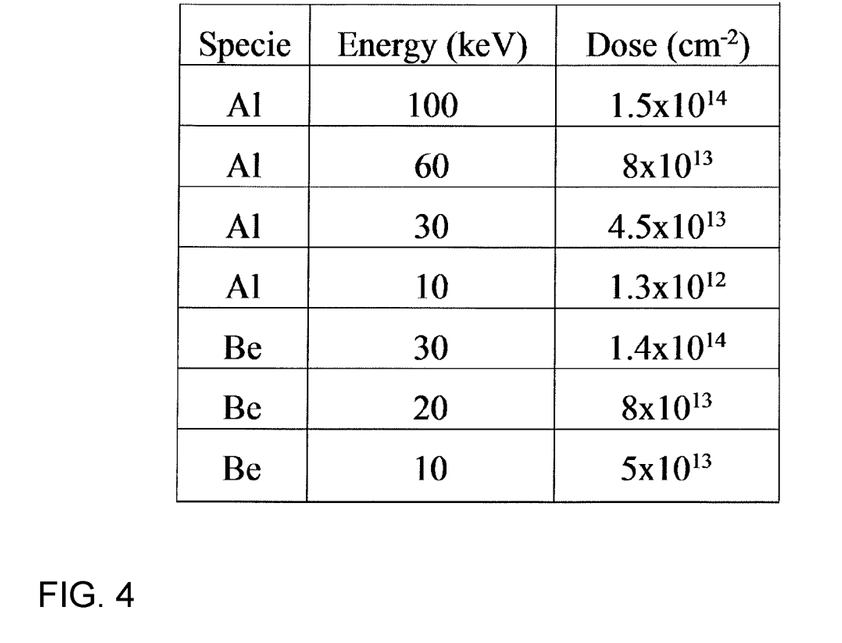
FIG. 4 provides a table illustrating exemplary doses and energies according to the method.

For example, the Al (Be) implantation profile shown in FIG. 2 can be obtained by four (three) consecutive implantations of Al dopants (Be dopants) with the energies $E_{Al,i}$ ($E_{Be,j}$) and doses $D_{Al,i}$ ($D_{Be,j}$) given in the table provided in FIG. 4.

The first implantation step and the second implantation step are exemplarily carried out at an elevated implantation temperature (hot implantation), exemplarily 500° C. By having an elevated implantation temperature, implantation damages can be alleviated compared to room temperature. The implantation temperature is however not limited to 500° C. and may also be performed at lower temperature or higher temperature, as long as the implantation temperature is kept sufficiently below the annealing temperature. For example, the temperature of the silicon carbide layer 1 is kept at a temperature below 1200° C., exemplarily below 1000° C., more exemplarily below 900° C.

Then, the annealing step is performed. In the annealing step, the SiC layer 1 is heated to a high temperature (annealing temperature), kept at this high temperature for some time and cooled down afterwards. By this, amorphization damages from the implantation process can be repaired. Further, interstitial dopants move to vacancy sites and substitutional sites where they become electrically active.

Importantly, in contrast to the prior art in which it is annealed immediately after a single implantation step, herein the annealing step is only carried out when both the first implantation step and the second implantation step are terminated. In this way, more Al—C—Be complexes are formed which are shallower ($E_v$+0.05 eV) over the valence band edge $E_v$ than Al complexes ($E_v$+0.22 eV) or Be complexes ($E_v$+0.23 eV) and therefore advantageous in the sense of the invention to increase the free hole concentration at room temperature. On the other hand, performing an annealing step after each implantation step would favor the formation of Al complexes and Be complexes.

For example, experimental Hall-effect measurements performed on samples co-implanted at 500° C. with Al and Be according to the doses $D_{Al,i}$ ($D_{Be,j}$) and energies $E_{Al,i}$ ($E_{Be,j}$) given in the table provided in FIG. 4 and annealed for 30 minutes at a temperature of 1600° C. and 1700° C., respectively, revealed that p-type conductivity arises after an annealing temperature of 1700° C. and that the activation ratio, calculated as the ratio between the sheet concentration and the total dose is above 50%. The person skilled in the art understands that these parameters are given as an example and not meant to be limiting. For example, by increasing the annealing temperature, the annealing duration may be shortened. In one embodiment, the annealing temperature is above 1500° C., exemplarily above 1600° C., more exemplarily above 1650° C. In another embodiment, the annealing temperature is below 1800° C., exemplarily below 1750° C.

According to an embodiment of the invention, the first implantation step and the second implantation step are performed such that in the distribution of the implanted Al dopants substantially overlaps the distribution of the implanted Be dopants. In this way a condition for the formation of Al—C—Be complexes is improved. For example, Al dopants and Be dopants may be implanted such that their implantation profiles substantially match each other (see FIG. 2).

To achieve this, the individual implantations ($E_{Al,i}$, $D_{Al,i}$, i=1, . . . $n_{Al}$) performed in the first implantation step and the individual implantations ($E_{Be,j}$, $D_{Be,j}$, j=1 . . . $n_{Be}$) performed in the second implantation step are performed such that the ratio $D_{Al,tot}/D_{Be,tot}$ of the total dose of Al dopants $D_{Al,tot}$ implanted in the first implantation step and the total dose of Be dopants $D_{Be,tot}$ implanted in the second implantation step into the preselected region 6 is in a range between 0.1 and 10, exemplarily between 0.3 and 3, more exemplarily in a range between 0.5 and 2. The individual implantation energies $E_{Al,i}$ ($E_{Be,i}$) are adjusted accordingly. For example, for a given implantation dose, the implantation energy for Al implantation $E_{Al,i}$ is about three times the implantation energy for Be implantation $E_{Be,i}$.

Optimal results may be obtained when the ratio $D_{Al,tot}/D_{Be,tot}$ is close to 1. Herein, the total dose $D_{Al,tot}$ ($D_{Be,tot}$) is defined as the sum of individual doses $D_{Al,i}$ ($D_{Be,i}$) implanted into the preselected region. For example, with the values given in the table provided in FIG. 4, the ratio of total doses is $D_{Al,tot}/D_{Be,tot}$ is 1.03.

In one exemplary embodiment according to the invention, the total implantation dose $D_{Al,tot}$ ($D_{Be,tot}$) is at least $5 \times 10^{13}$ cm$^{-2}$, exemplarily at least $1 \times 10^{14}$ cm$^{-2}$ The method according to the invention yields improved electrical activation. For instance activation ratio at room temperature calculated as a ratio between a sheet concentration of free holes in the preselected region after the annealing step measured by Hall-effect measurements and a total dose, which is the sum of the total dose of Be and of the total dose of Al, is above 20%, exemplarily above 30%, more exemplarily above 40%. This means, that the same free hole concentration p at room temperature can be achieved with a lower implantation dose compared to the prior art. In an exemplary embodiment according to the invention, the total implantation dose $D_{Al,tot}$ ($D_{Be,tot}$) therefore is below $5 \times 10^{15}$ cm$^{-2}$, exemplarily below $2 \times 10^{15}$ cm$^{-2}$.

In a modification of the method, the SiC layer 1 is an n-type SiC layer 1 doped with nitrogen (N). The method is performed according to the steps described above, however additional complexes may be formed due to the presence of N such as Al—N—Al complexes (Ev+0.11 eV), Be—N—Be complexes (Ev+0.05 eV) and Al—N—Be complexes (Ev+0.09) which are also electrically active. All of them are shallower than Al complexes (Ev+0.22 eV) or Be complexes (Ev+0.23 eV) generated by prior art methods and are therefore beneficial to increase the free hole concentration at room temperature. The higher the nitrogen concentration [N], the more nitrogen complexes can be formed. For example, the SiC layer 1 includes nitrogen atoms at a concentration [N] of at least $10^{16}$ cm$^{-3}$, exemplarily at least $10^{18}$ cm$^{-3}$.

Figure 3:
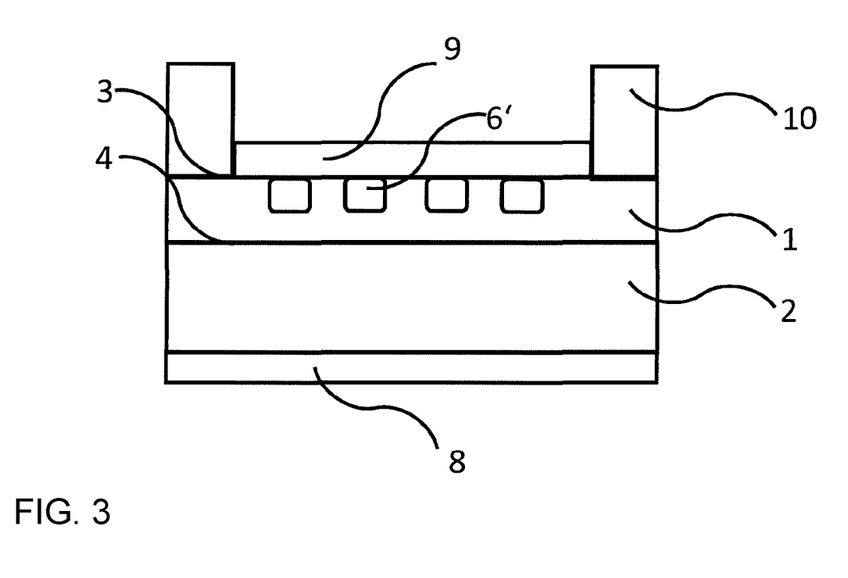
FIG. 3 illustrates an exemplary embodiment of a semiconductor device in which the p-type SiC layer according to the invention is used.

Next, there is shown a Junction Barrier Schottky (JBS) diode as an exemplary embodiment of a semiconductor device which uses the p-type silicon carbide (SiC) layer according to the invention. Reference is made to FIG. 3.

The JBS comprises an anode 9, a cathode 8, a SiC substrate 2, a SiC layer 1, a p-type region 6 and a passivation layer 10. The SiC layer 1 is formed on a SiC substrate 2 and has a first main side 3 and a second main side 4 opposite to the first main side 3. The SiC substrate 2 is formed on the cathode 8. The SiC layer 1 and the SiC substrate 2 may be any polytype of SiC such as 4H—SiC, 6H—SiC or 3 C—SiC, for example. The SiC substrate 2 is an n$^+$-type SiC substrate doped with nitrogen (N). The SiC layer 1 is an n-type SiC layer 1 doped at a lower nitrogen concentration than the SiC substrate 2. The SiC layer 1 forms a drift layer. A layer thickness of the SiC layer 1 depends on the nominal blocking voltage of the power semiconductor device. The anode 9 is formed on the SiC layer 1 and forms a Schottky contact with the SiC layer 1. The passivation layer 10 covers the portion of the SiC layer 1 exposed by the anode 9.

The SiC layer 1 includes at least one p-type region 6'. The at least one p-type r region 6' may form a pin-junction grid integrated into the SiC layer 1. The pin-junction grid may be configured to move the peak electric field at reverse bias to the bottom of the p-type region 6' away from the Schottky contact.

The p-type region 6' includes Al dopants and Be dopants. A concentration of nitrogen atoms [N] in the p-type region 6' is exemplarily at least $1 \times 10^{16}$ cm$^{-3}$, exemplarily at least $1 \times 10^{18}$ cm$^{-3}$. In an exemplary embodiment, the concentration of aluminum [Al] in the p-type region (6') is higher than $1 \times 10^{18}$ cm$^{-3}$. For example, the Al dopants and Be dopants are implanted according to the implantation profile shown in FIG. 4. The invention is however not limited on this specific implantation profiles. The concentration of the implanted aluminium [Al] and the implanted beryllium [Be] in the p-type region can also be such that the following inequality applies: 0.1<[Al]/[Be]<10, exemplarily 0.3 <[Al]/[Be]<3, more exemplary 0.5 <[Al]/[Be]<2. This means, the concentration of implanted Al and concentration of implanted Be in the p-type region is within the same order of magnitude, exemplary about the same. Accordingly, more of the beneficial Al—C—Be complexes explained above may be provided. In another exemplary embodiment, the concentration of N, implanted Al and implanted Be is about the same.

The p-type region 6' implanted into the n-type SiC layer 1 according to the invention provides a higher free hole concentration p at room temperature than in the prior art. In an exemplary embodiment of the device according to the invention, the following inequality applies: 0.1<p/([Al]+[Be])<1, exemplarily 0.2<p/([Al]+[Be])<1, wherein [Al] is a concentration of aluminum dopants in the p-type region 6', [Be] is the concentration of beryllium dopants in the p-type region 6', and p is a concentration of free holes in the p-type region 6'.

The higher the concentration of the implanted aluminum dopants [Al] and beryllium dopants [Be], the higher is the free hole concentration which can be achieved. For example, the free hole concentration in the p-type region 6' at room temperature is higher than $1 \times 10^{18}$ cm$^{-3}$, exemplarily higher than $1 \times 10^{19}$ cm$^{-3}$, more exemplarily higher than $2 \times 10^{19}$ cm$^{-3}$. Hence, a p-type SiC layer 1 according to the invention may help to decrease leakage currents and to increase breakdown voltages in the JBS diode presented as an exemplary embodiment.

It will be apparent for persons skilled in the art that modifications of the above described methods and embodiments are possible without departing from the idea of the invention as defined by the appended claims.

The p-type doped SiC layer 1 according to the invention is characterized in that the p-type region 6' has a higher free hole concentration p than prior art. An exemplary use of the p-type doped SiC layer was described with reference to a JBS diode. However, the p-type doped SiC layer 1 according to the invention may also be used in any other SiC based devices, which requires a highly doped p-type region, such as a JFET, or a pn diode, for example, and may also help to achieve higher breakdown voltages and improved on-state characteristics.

In the example shown, the n-type SiC layer 1 had an n-type nitrogen pre-doping and the doping was lower than for the SiC substrate 2. The SiC layer 1 may also have the same doping or a higher doping than the SiC substrate. The SiC layer 1 can also be without nitrogen pre-doping.

In the exemplary embodiment, the SiC layer was provided on a SiC substrate.

The SiC layer may also be provided without the substrate or be the substrate.

In the description of the embodiment, an ion beam blocking mask 5 is used. The implantation can also be performed without the ion beam blocking mask 5.

In the embodiment shown the ion beams $7_{Al}$ and $7_{Be}$ are directed perpendicular to the first main side 3 of the SiC layer 1. However, they can also be tilted at an angle to the normal of the first main side 3.

In the embodiment shown, the first implantation step is performed before the second implantation step. The first implantation step may however also be performed after the second implantation step or essentially at the same time.

It should be noted that the term "comprising" does not exclude other elements or steps and that the indefinite article "a" or "an" does not exclude the plural. Also, elements described in association with different embodiments may be combined.

LIST OF REFERENCE SIGNS 1 silicon carbide layer
2 silicon carbide substrate
3 first main side
4 second main side
5 ion beam blocking layer
6 preselected region
6' p-type region
$7_{Al}$ Ion beam of the first implantation step
$7_{Be}$ Ion beam of the second implantation step
8 cathode
9 anode
10 passivation layer
$D_{Al,i}$ implantation dose for the i-th Al implantation
$E_{Al,i}$ implantation energy for the i-th Al implantation
$D_{Be,j}$ implantation dose for the j-th Be implantation
$E_{Be,j}$ implantation energy for the j-th Be implantation
$D_{Al,tot}$ total Al implantation dose (sum of the doses of all Al implantations)
$D_{Be,tot}$ total Be implantation dose (sum of the doses of all Be implantations)
[Al] concentration of implanted Al atoms
[Be] concentration of implanted Be atoms
[N] concentration of N atoms
p concentration of free holes

The invention claimed is:

1. A method for p-type doping of a silicon carbide layer, the method comprising:
   providing the silicon carbide layer;
   performing a first implantation step of implanting aluminum dopants into a preselected region of the silicon carbide layer by ion implantation;
   performing an annealing step of annealing the silicon carbide layer after performing the first implantation step; and
   performing a second implantation step of implanting beryllium dopants into the preselected region by ion implantation before the annealing step, wherein a ratio of the total aluminum dose in the first implantation step to the total beryllium dose in the second implantation step is in a range between 0.1 and 10.

2. The method according to claim 1, wherein during a time period between the first implantation step and the second implantation step the silicon carbide layer is kept at a temperature below 1200° C.

3. The method according to claim 2, wherein during a time period between the first implantation step and the second implantation step the silicon carbide layer is kept at a temperature below 900° C.

4. The method according to claim 1, wherein an annealing temperature in the annealing step is above 1500° C.

5. The method according to claim 4, wherein the annealing temperature in the annealing step is below 1800° C.

6. The method according to claim 4, wherein the annealing temperature in the annealing step is above 1650° C.

7. The method according to claim 1, wherein at least the preselected region of the silicon carbide layer includes nitrogen atoms at a concentration of at least $10^{16}$ cm$^{-3}$.

8. The method according to claim 7, wherein at least the preselected region of the silicon carbide layer includes nitrogen atoms at a concentration of at least $10^{18}$ cm$^{-3}$.

9. The method according to claim 1, wherein the first implantation step is performed before the second implantation step.

10. The method according to claim 1, wherein a total aluminum implantation dose in the first implantation step is at least $5 \times 10^{13}$ cm$^{-2}$.

11. The method according to claim 1, wherein the total aluminum implantation dose in the first implantation step is below $5 \times 10^{15}$ cm$^{-2}$.

12. The method according to claim 1, wherein an activation ratio at room temperature calculated as a ratio between a sheet concentration of free holes in the preselected region after the annealing step and a total dose, which is the sum of the total dose of beryllium and of the total dose of aluminum, is above 20%.

13. The method according to claim 12, wherein the activation ratio at room temperature is above 40%.

14. The method according to claim 1, wherein the ratio of the total aluminum dose in the first implantation step to the total beryllium dose in the second implantation step is in a range between 0.5 and 2.

15. A silicon carbide layer comprising a p-type region, wherein the following inequality applies:
   0.1<[Al]/[Be]<10, wherein [Al] is a concentration of aluminum atoms in the p-type region, and [Be] is a concentration of beryllium atoms in the p-type region.

16. The silicon carbide layer according to claim 15, wherein [Al]>$1 \times 10^{18}$ cm$^{-3}$.

17. The silicon carbide layer according to claim 15, wherein a concentration of nitrogen atoms [N] in the p-type region is at least $1 \times 10^{16}$ cm$^{-3}$.

18. The silicon carbide layer according to claim 15, wherein the following inequality applies:
   0.1<p/([Al]+[Be])<1, wherein p is a concentration of free holes in the p-type region.

19. The silicon carbide layer according to claim 15, wherein the free hole concentration p in the p-type region at room temperature is higher than $1 \times 10^{18}$ cm$^{-3}$.

20. The silicon carbide layer according to claim 19, wherein the free hole concentration p in the p-type region at room temperature is higher than $2\times10^{19}$ cm$^{-3}$.

21. The silicon carbide layer according to claim 15, wherein the following inequality applies: $0.5<[Al]/[Be]<2$.

* * * * *